US009691615B2

United States Patent
Brink et al.

(10) Patent No.: US 9,691,615 B2
(45) Date of Patent: Jun. 27, 2017

(54) CHEMOEPITAXY-BASED DIRECTED SELF ASSEMBLY PROCESS WITH TONE INVERSION FOR UNIDIRECTIONAL WIRING

(71) Applicant: International Business Machines Corporation, Armonk, NY (US)

(72) Inventors: Markus Brink, White Plains, NY (US); Joy Cheng, San Jose, CA (US); Gregory S. Doerk, Mountain View, CA (US); Michael A. Guillorn, Yorktown Heights, NY (US); HsinYu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 117 days.

(21) Appl. No.: 14/839,235

(22) Filed: Aug. 28, 2015

(65) Prior Publication Data
US 2017/0062271 A1    Mar. 2, 2017

(51) Int. Cl.
*H01L 21/033* (2006.01)
*H01L 21/768* (2006.01)
*H01L 21/027* (2006.01)
*H01L 21/308* (2006.01)

(52) U.S. Cl.
CPC ...... *H01L 21/0337* (2013.01); *H01L 21/0271* (2013.01); *H01L 21/0332* (2013.01); *H01L 21/0338* (2013.01); *H01L 21/3086* (2013.01); *H01L 21/76802* (2013.01); *H01L 21/76832* (2013.01); *H01L 21/76877* (2013.01)

(58) Field of Classification Search
None
See application file for complete search history.

(56) References Cited

U.S. PATENT DOCUMENTS 7,553,760 B2    6/2009   Yang et al.
7,592,247 B2    9/2009   Yang et al.
7,767,099 B2    8/2010   Li et al.
(Continued)

OTHER PUBLICATIONS

US 8,123,961, 02/2012, Millward (withdrawn)

*Primary Examiner* — Mary Wilczewski
*Assistant Examiner* — Erik T Peterson
(74) *Attorney, Agent, or Firm* — Scully, Scott, Murphy & Presser, P.C.; Louis J. Percello, Esq.

(57) ABSTRACT

After forming a material stack including, from bottom to top, a dielectric material layer, a transfer layer, a hard mask layer and a neutral layer over a substrate, the neutral layer and the hard mask layer is patterned to create trenches therein that correspond to areas where unnecessary lines generated by a self-assembly of a self-assembling material subsequently formed and/or unnecessary portions of such lines are present. The self-assembling material is applied over the top surfaces of the patterned neutral layer and the transfer layer to form a self-aligned lamellar structure including alternating first and second domains. The second domains are removed selective to the first domains to provide a directed self-assembly (DSA) pattern of the first domains. Portions of the first domains not intersecting the trenches can be transferred into the patterned hard mask layer, resulting in a composite pattern of a pattern of trenches and the DSA pattern.

20 Claims, 17 Drawing Sheets

(56) References Cited

U.S. PATENT DOCUMENTS

| | | | |
|---|---|---|---|
| 8,309,278 B2 | 11/2012 | Yang et al. | |
| 8,336,003 B2 | 12/2012 | Cheng et al. | |
| 8,486,611 B2 | 7/2013 | Millward et al. | |
| 9,368,350 B1* | 6/2016 | He | H01L 21/0338 |
| 2009/0258303 A1 | 10/2009 | Ryu | |
| 2011/0008956 A1* | 1/2011 | Lee | H01L 21/0337 |
| | | | 438/618 |
| 2013/0034811 A1 | 2/2013 | Peeters et al. | |
| 2013/0302981 A1 | 11/2013 | Millward et al. | |
| 2014/0148012 A1* | 5/2014 | Guillorn | B81C 1/00031 |
| | | | 438/700 |
| 2015/0195916 A1 | 7/2015 | Cheng et al. | |
| 2016/0068430 A1* | 3/2016 | Suenaga | C03C 15/00 |
| | | | 216/41 |

* cited by examiner

CHEMOEPITAXY-BASED DIRECTED SELF ASSEMBLY PROCESS WITH TONE INVERSION FOR UNIDIRECTIONAL WIRING

BACKGROUND

The present application relates to a method of forming nanoscale structures, and more particularly to a method of forming customized line structures using a composite pattern of a lithographically defined template pattern and a directed self-assembly pattern of a self-assembling material that is self-aligned with the template pattern.

Directed self-assembly (DSA) of block copolymers is an emerging patterning technology for generating narrow lines in integrated circuits (ICs) with smaller pitches beyond the current optical lithographic limit. However, IC designs typically include customized elements such as aperiodic, isolated, or discontinuous lines. While DSA has shown promise in creating large areas of dense line patterns with constant pitch, forming lines of varying pitches and/or dimensions is difficult. The most straightforward way to obtain these lines using DSA is to trim the DSA-generated pattern employing lithographic masks. Unfortunately, modification of lines corresponding to individual self-assembled domains in the DSA pattern is very challenging given the limited resolution of available lithography tools. More critically, as the size of individual self-assembled domains useful for patterning is approaching the scale of the overlay error associated with misalignment of the lithographic trim pattern to the self-assembled pattern, patterning errors of such commensurate scale are detrimental to device yield, performance, reliability, and uniformity. Therefore, a method for customizing patterns generated by DSA of a self-assembling material without involving additional overlay alignment steps is needed.

SUMMARY

The present application provides a method for customizing patterns generated by directed self-assembly (DSA) of a self-assembling material such that additional overlay alignment steps can be eliminated. The customized patterned can be fabricated as a composite pattern of a lithographically defined template pattern and a directed self-assembly pattern of a self-assembling material that is self-aligned with the template pattern.

According to an aspect of the present application, a method of forming a semiconductor structure is provided. The method includes first forming a vertical stack of a patterned hard mask layer and a patterned neutral layer overlying the patterned hard mask layer over a transfer layer located over a substrate. The patterned hard mask layer and the patterned neutral layer include a first pattern of trenches exposing portions of the transfer layer. After applying a self-assembling material over the transfer layer and the patterned neutral layer, a self-assembled self-aligned structure of the self-assembling material is formed across top surfaces of the transfer layer and the patterned neutral layer. The self-assembled self-aligned structure includes alternating first domains and second domains composed of first and second components of the self-assembling material, respectively. Next, a second pattern of the first domains is formed by removing the second domains selective to the first domains. After patterning the patterned neutral layer and the patterned hard mask layer by employing portions of the first domains not intersecting the trenches as an etch mask, the transfer layer is patterned employing remaining portions of the patterned hard mask layer as an etch mask to provide a patterned transfer layer. Next, tone-inversion layer portions are formed by filling the spaces between the patterned transfer layer with a tone-inversion material. Subsequently, the patterned transfer layer is removed, resulting in an inverse image of a composite pattern obtained from the combination of the first pattern and the second pattern. This inverse pattern is transferred into an underlying film or the substrate, depending on the application, and is subsequently filled with the target material or materials, for example, metals for a wiring applications, and then planarized.

DETAILED DESCRIPTION

Figure 1A:
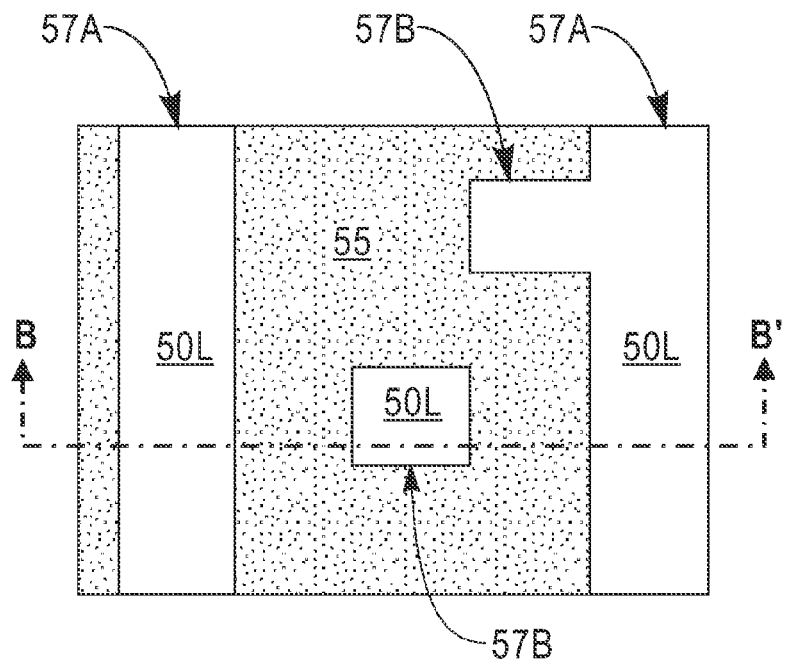
FIG. 1A is a top view of an exemplary semiconductor structure after forming a material stack including, from bottom to top, a dielectric material layer, a transfer layer, a hard mask layer, and a neutral layer over a substrate, and a patterned photoresist layer that defines a template pattern over the material stack according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
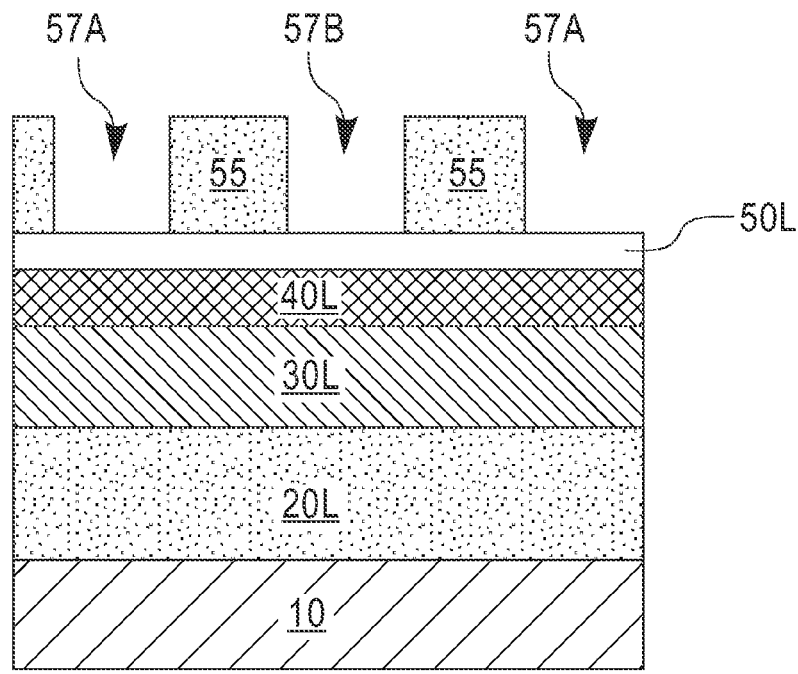
FIG. 1B is a cross-sectional view of the exemplary semiconductor structure of FIG. 1A along the vertical plane B-B'.

Referring to FIGS. 1A and 1B, an exemplary semiconductor structure according to an embodiment of the present application includes a material stack and a patterned photoresist layer 55 formed thereon. The material stack is formed on a substrate 10 and it includes, from bottom to top, a dielectric material layer 20L, a transfer layer 30L, a hard mask layer 40L, and a neutral layer 50L.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The dielectric material layer 20L may include a dielectric material such as silicon dioxide, silicon nitride, silicon oxynitride, carbon-doped oxide, organic polymer insulator, or a dielectric metal oxide such as hafnium oxide, aluminum oxide, or a combination thereof. The dielectric material layer 20L can be formed by conventional deposition processes, such as, for example, chemical vapor deposition (CVD), plasma-enhanced CVD (PECVD), physical vapor deposition (PVD) or atomic layer deposition (ALD). The thickness of the dielectric material layer 20L can be from 5 nm to 100 nm, although lesser and greater thicknesses can also be employed.

The transfer layer 30L may include an organic planarizing material. As used herein, an organic planarizing material is an organic material such as a polymer that is applied with a surface having topography to provide a smooth and planar top surface. In one embodiment, the transfer layer 30L includes a carbon-rich material. The term "carbon-rich" refers to a material having a composition comprising greater than about 50% by weight carbon, preferably greater than about 70% by weight carbon, and more preferably from about 75% to about 80% by weight carbon, based upon the total solids in the carbon-rich composition taken as 100% by weight. Exemplary carbon-rich materials include, but are not limited to, spin-on carbon (SOC) or amorphous carbon. The transfer layer 30L can be formed by spin coating or CVD. The thickness of the transfer layer 30L can be from 10 nm to 300 nm, although lesser and greater thicknesses can also be employed.

The hard mask layer 40L may include a dielectric material such as silicon dioxide, silicon nitride, silicon oxynitride, a metal hard mask material, a silicon- or titanium-containing antireflective coating (ARC) material as known in the art, or combinations thereof. The hard mask layer 40L can be formed, for example, by CVD, ALD, or spin coating. The thickness of the hard mask layer 40L can be from 1 nm to 20 nm, although lesser and greater thicknesses can also be formed.

The neutral layer 50L is an orientation control layer which allows a self-assembling material to be subsequently applied thereon to orient perpendicularly to the surface for obtaining a high resolution line pattern. The neutral layer 50L may include a material having substantially the same affinity toward different components of the self-assembling material. The neutral layer 50L depends on the specific self-assembling material to be used and may include hydrogen silsesquioxane (HSQ), methyl silsesquioxane (MSQ), a random copolymer of the constituent blocks of the self-assembling material, for example, polystyrene (PS) and polymethylmethacrylate (PMMA), or a polymer blend.

The patterned photoresist layer 55 defines a template pattern for customizing dense line patterns formed by DSA of a self-assembling material. The patterned photoresist layer 55 can be formed by first applying a photoresist layer (not shown) on the top surface of the neutral layer 50L and patterning the photoresist layer by conventional lithography and etching techniques. Trenches are thus created in the patterned photoresist layer 55. The trenches include first trenches 57A located at areas where unnecessary lines formed by the DSA of the self-assembling material, are present, and second trenches 57B located at areas where unnecessary portions of lines are present. The second trenches 57B cut long lines into shorter ones. Each of the trenches 57A, 57B has a width configured to be approximately in integer multiples of the self-assembling material periodicity. A portion of a top surface of the neutral layer 50L can be exposed at the bottom of each of the trenches 57A, 57B.

Figure 2A:
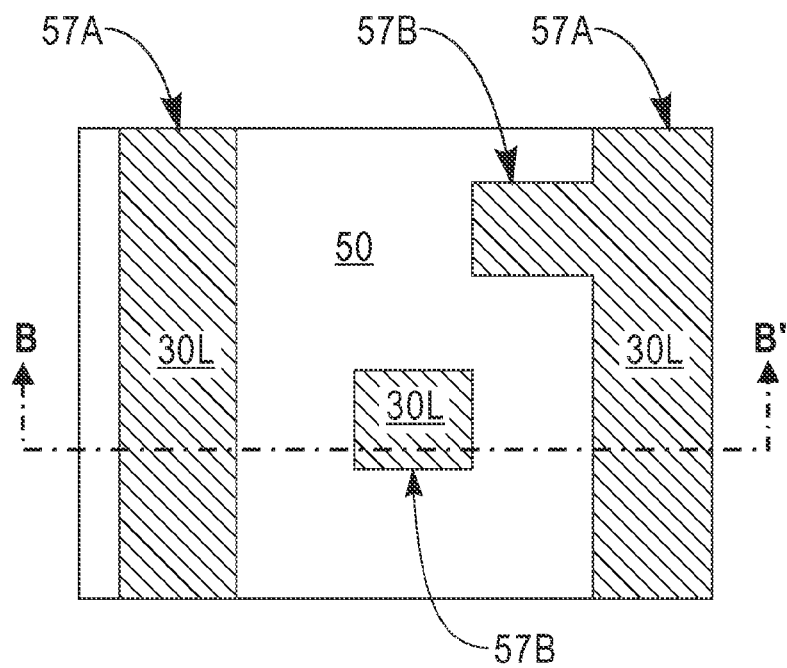
FIG. 2A is a top view of the exemplary semiconductor structure of FIGS. 1A and 1B after removing portions of the neutral layer and the hard mask layer that are not covered by the patterned photoresist layer to provide a patterned neutral layer and a patterned hard mask layer and after removing the patterned photoresist layer after the pattern transfer.
Figure 2B:
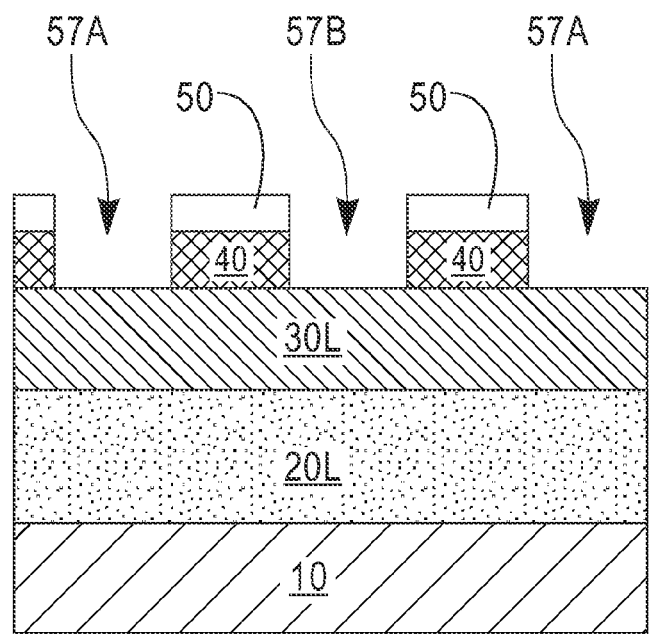
FIG. 2B is a cross-sectional view of the exemplary semiconductor structure of FIG. 2A along the vertical plane B-B'.

Referring to FIGS. 2A and 2B, the pattern of trenches 57A, 57B in the patterned photoresist layer 55 is transferred into the neutral layer 50L and the hard mask layer 40L by at least one anisotropic etch. Trenches 57A, 57B are thus extended through the neutral layer 50L and the hard mask layer 40L to provide a patterned neural layer 50 and a patterned hard mask layer 40. Portions of the transfer layer 30L can be exposed at the bottom of the trenches 57A, 57B. The template pattern defined by the patterned photoresist layer 55 is thus transferred into the neutral layer 50L and the hard mask layer 40L. The at least one anisotropic etch can be a dry etch, such as reactive ion etch (RIE), that removes materials of the neutral layer 50L and the hard mask layer 40L selective to the patterned photoresist layer 55. In one embodiment, a plasma comprising oxygen may be used to remove portions of the neutral layer 50L and the hard mask layer 40L that are not covered by the patterned photoresist layer 55. The patterned photoresist layer 55 is then stripped away using solvent stripper or plasma etching. The patterned neutral layer 50 must maintain its neutrality after the removal of the patterned photoresist layer 50, thus allowing proper alignment of the self-assembling material subsequently applied thereon.

Figure 3A:
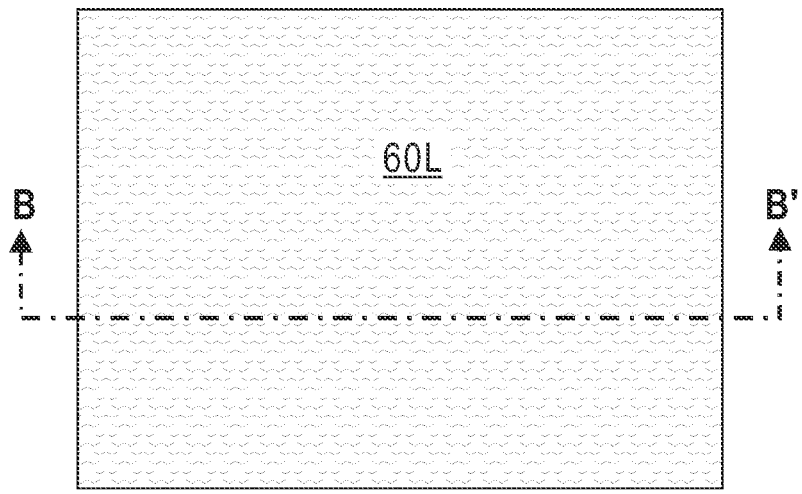
FIG. 3A is a top view of the exemplary semiconductor structure of FIGS. 2A and 2B after applying a self-assembling material over the transfer layer and the patterned neutral layer.
Figure 3B:
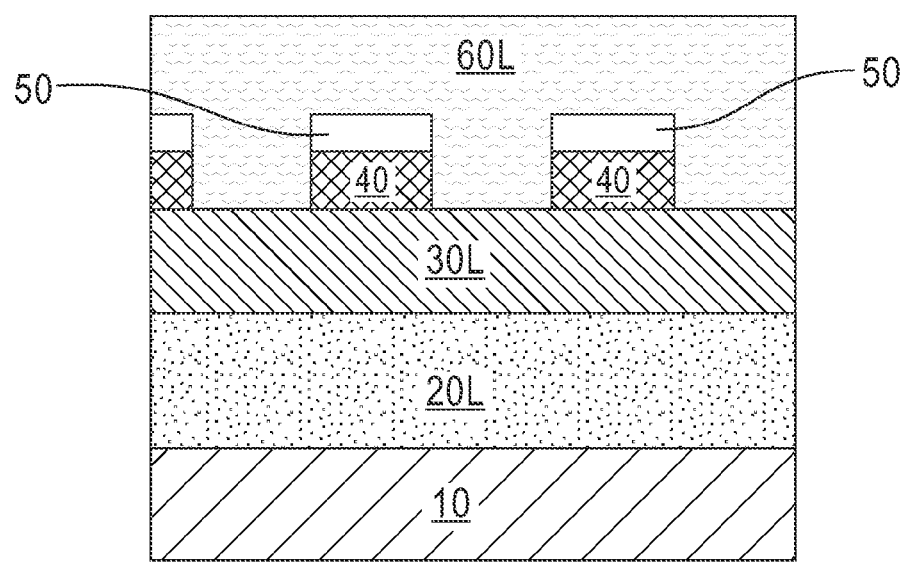
FIG. 3B is a cross-sectional view of the exemplary semiconductor structure of FIG. 3A along the vertical plane B-B'.

Referring to FIGS. 3A and 3B, a self-assembling material is applied over the patterned neutral layer 50 and the exposed portions of the transfer layer 30L and into the trenches 57A, 57B to form a self-assembling material layer 60L. The self-assembling material can be applied, for example, by spin coating. The self-assembling material layer 60L may be self-planarizing. The self-assembling material layer 60L is applied so that the top surface of the self-assembling material layer 60L is above the top surface of the patterned neutral layer 50.

The self-assembling material may include any material capable of forming a self-assembled periodic pattern. In one embodiment, the self-assembling material is a block copolymer. Under suitable conditions, blocks of such copolymer phase separate into micro-domains to reduce the total free energy, and in the process, ordered nanoscale features of dissimilar chemical compositions are formed. Suitable block copolymers include, but are not limited to, polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, the self-assembling material layer 60L includes a diblock copolymer of PS and PMMA.

Figure 4A:
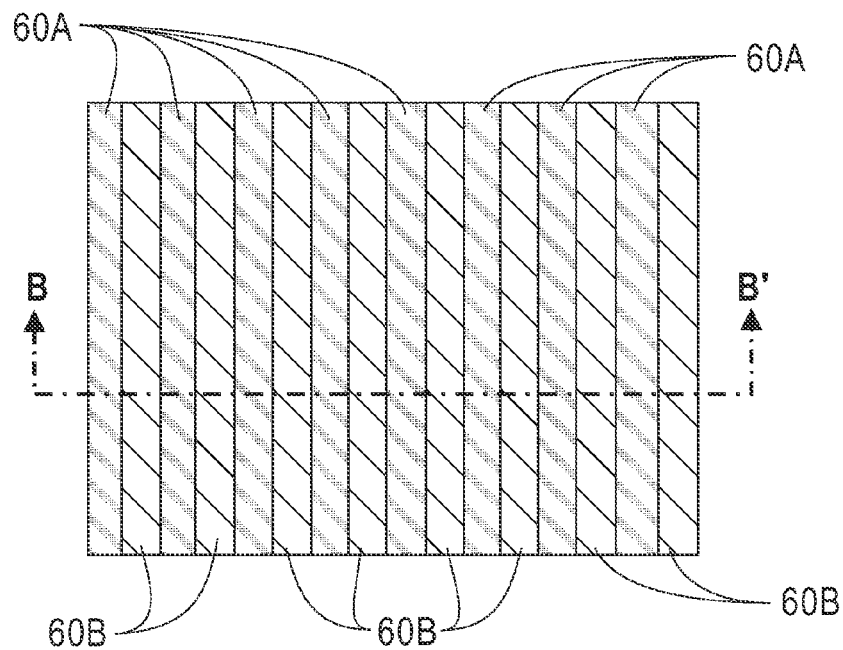
FIG. 4A is a top view of the exemplary semiconductor structure of FIGS. 3A and 3B after phase separation of a self-assembling material to provide a lamellar structure containing alternating first domains and second domains that are aligned to a template pattern provided by the patterned neutral layer and the patterned hard mask layer in instances where a top surface of the transfer layer is neutral to both components of the self-assembling material.
Figure 4B:
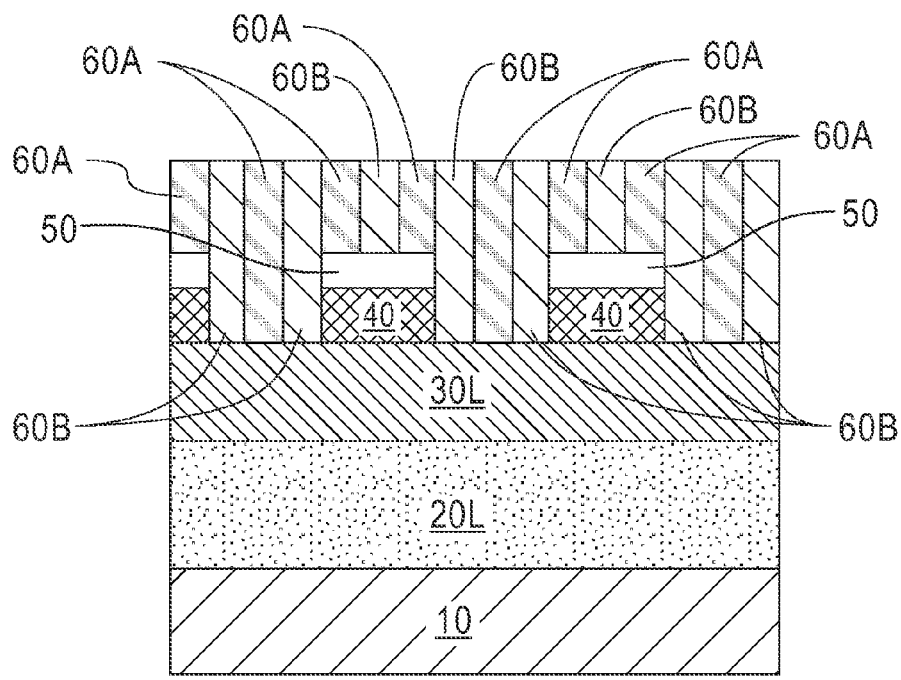
FIG. 4B is a cross-sectional view of the exemplary semiconductor structure of FIG. 4A along the vertical plane B-B'.

Referring to FIGS. 4A and 4B, a nanoscale self-assembled self-aligned structure is formed over the top surfaces of the patterned neutral layer 50 and the transfer layer 30L by micro-phase separation of the self-assembling material. Through chemoepitaxy, self-alignment of first and second components of the self-assembling material to the top surface of the patterned neutral layer 50 and the trench surfaces (i.e., sidewalls and bottom surfaces of trenches 57A, 57B) can be induced. The nanoscale self-assembled self-aligned structure is aligned to the patterned neutral layer 50 and the trench (57A, 57B) surfaces, and is herein referred to as a "self-aligned structure." In one embodiment and as shown in FIG. 4B, in instances where the top surface of the transfer layer 30L is neutral to the first and the second components of the self-assembling material, the micro-phase separation of the self-assembling material leads to the formation of a lamellar structure with alternating domains (i.e., lines) oriented perpendicularly to the top surfaces of the patterned neutral layer 50 and the transfer layer 30L. In some embodiments of the present application, the surfaces of the trenches 57A, 57B may be treated with a pinning material to facilitate the formation of the lamellar structure. The lamellar structure contains first domains 60A composed of a first component of the self-assembling material and second domains 60B composed of a second component of the self-assembling material. The width of each type of the first domains 60A and the second domains 60B typically ranges from 5 nm to 50 nm. In one embodiment and when the self-assembling material is a diblock copolymer of PS and PMMA, the first component can be PS, and the second component can be PMMA.

The micro-phase separation of the self-assembling material can be achieved, for example, by annealing at an elevated temperature. The anneal may be performed, for example, at an elevated temperature from about 50° C. to about 300° C. for a duration from 30 seconds to about 48 hours, and under an inert gas environment, such as under nitrogen or argon. The self-assembling material layer 60L can also be annealed by exposure to solvent vapors at a controlled vapor pressure at room temperature or elevated temperature, also known as solvent vapor annealing, to form the first domains 60A and the second domains 60B. The anneal may be performed, for example, between temperatures ranging from 10° C. to about 100° C. for a duration from 30 seconds to about 48 hours. In one embodiment, the solvent anneal may be performed in which the self-assembling material is simultaneously subjected to microwave radiation.

Figure 5A:
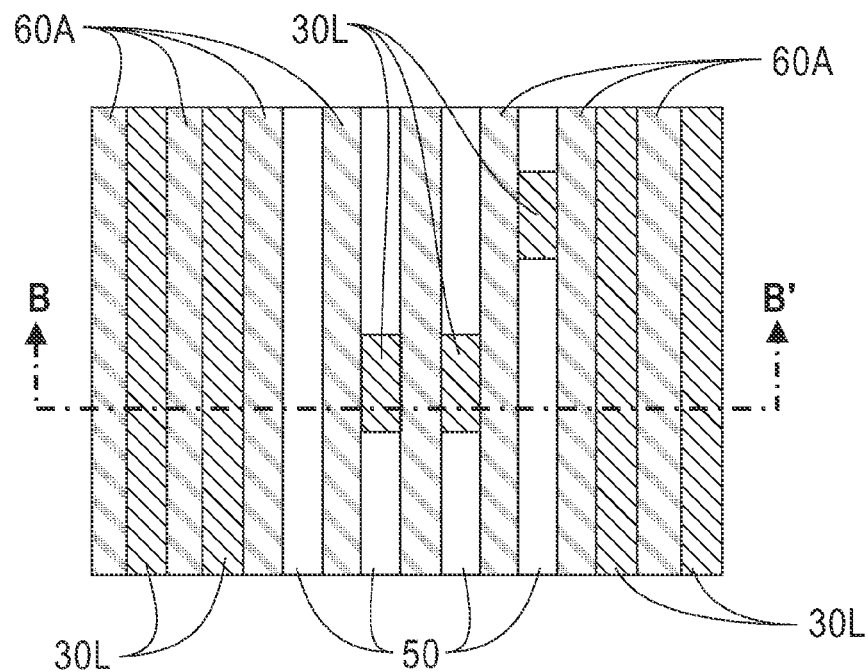
FIG. 5A is a top view of the exemplary semiconductor structure of FIGS. 4A and 4B after removing second domains selective to first domains to form a DSA pattern including first domains.
Figure 5B:
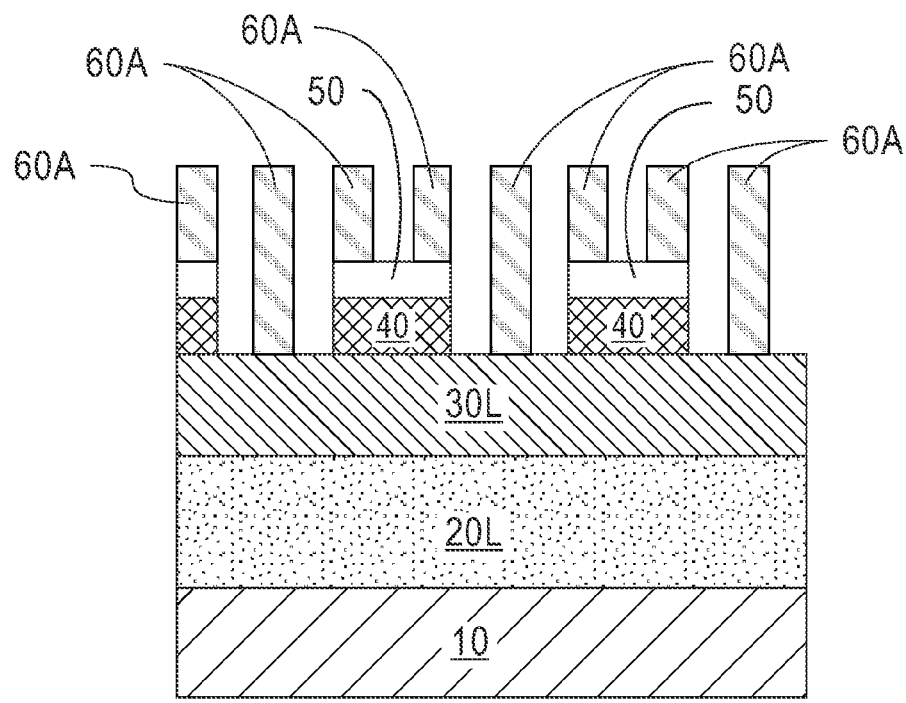
FIG. 5B is a cross-sectional view of the exemplary semiconductor structure of FIG. 5A along the vertical plane B-B'.

Referring to FIGS. 5A and 5B, one type of domains is completely removed selective to the other type of domain. In one embodiment and as shown in FIGS. 5A and 5B, the second domains 60B can be removed selective to first domains 60A. In this case, the second component of the self-assembling material is removed selective to the first component of the self-assembling material without substantially etching the transfer layer 30L. The removal of the second domains 60B selective to the first domains 60A can be performed, for example, by an anisotropic etch that removes the second component selective to the first component. For example, when the self-assembling material is a diblock copolymer of PS and PMMA, the PMMA component can be selectively removed by a dry etch using oxygen and/or argon and/or fluorocarbon gas chemistry. A DSA pattern including the first domains 60A is formed over the patterned neutral layer 50 and the transfer layer 30L. The first domains 60A constitute a set of protruding structures that protrudes above the top surfaces of the patterned neutral layer 50 and the transfer layer 30L.

Figure 6A:
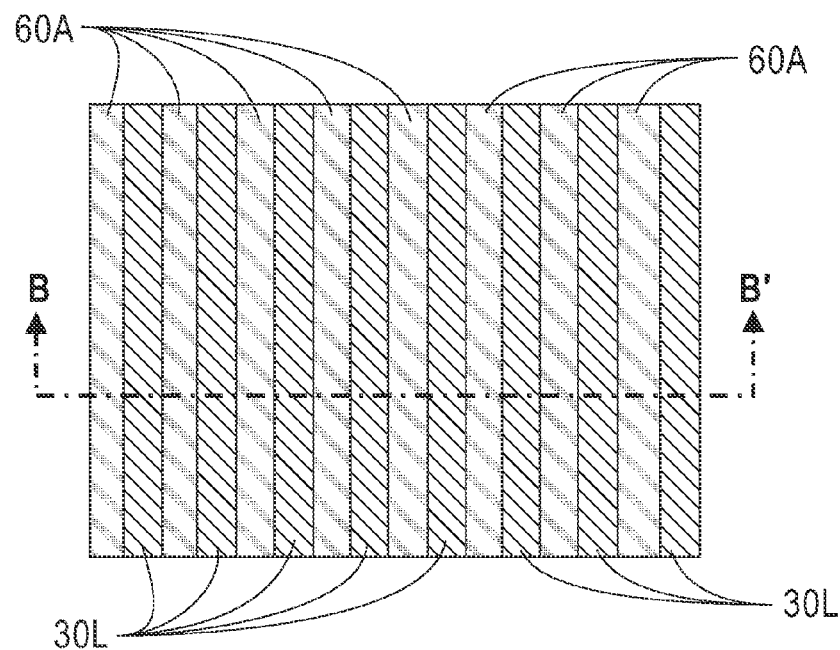
FIG. 6A is a top view of the exemplary semiconductor structure of FIGS. 5A and 5B after transferring the DSA pattern into the patterned neutral layer and the patterned hard mask layer using the first domains as an etch mask.
Figure 6B:
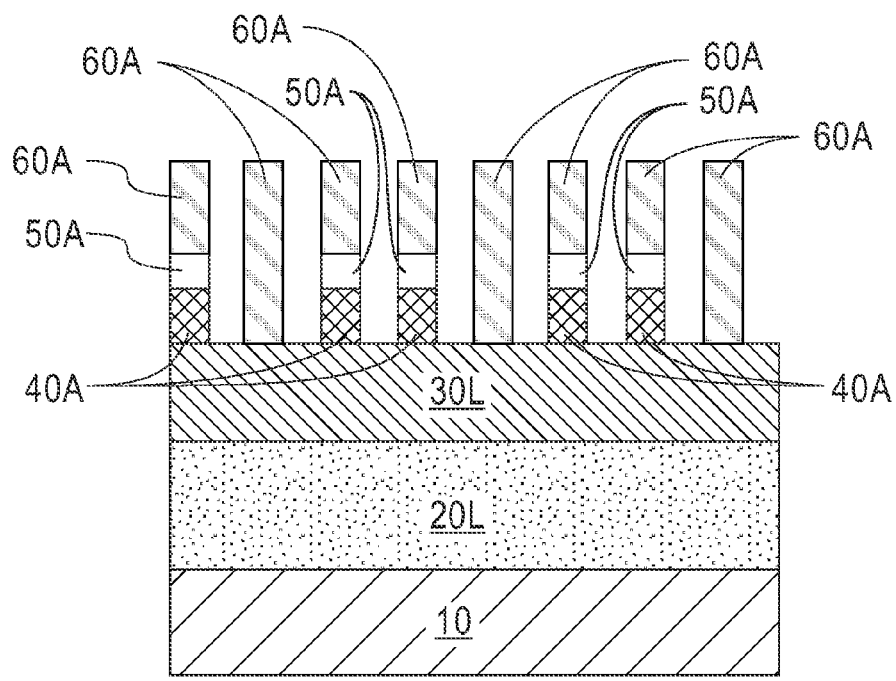
FIG. 6B is a cross-sectional view of the exemplary semiconductor structure of FIG. 6A along the vertical plane B-B'.

Referring to FIGS. 6A and 6B, portions of the DSA pattern intersecting the template pattern is transferred into the patterned neutral layer 50 and the patterned hard mask layer 40 by at least one anisotropic etch. The anisotropic etch can be a dry etch such as, for example, RIE. Portions of the patterned neutral layer 50 and the underlying patterned hard mask layer 40 that are not covered by the first domains 60A are thus removed employing the first domain 60A as an etch mask to expose additional portions of the transfer layer 30L. Since the patterned neutral layer 50 and the patterned hard mask layer 40 contains the template pattern therein, the transfer of the DSA pattern into the patterned neutral layer 50 and the patterned hard mask layer 40 by the anisotropic etch forms a composite pattern, which is the overlapping areas of the first domains 60A and the patterned neutral layer 50. These overlapping areas correspond to areas of the first domains 60A not intersecting the trenches 57A, 57B. The remaining portions of the patterned neutral layer 50 constitute the patterned neutral layer portions 50A. The remaining portions of the patterned hard mask layer 40 constitute the patterned hard mask layer portions 40A.

Figure 7A:
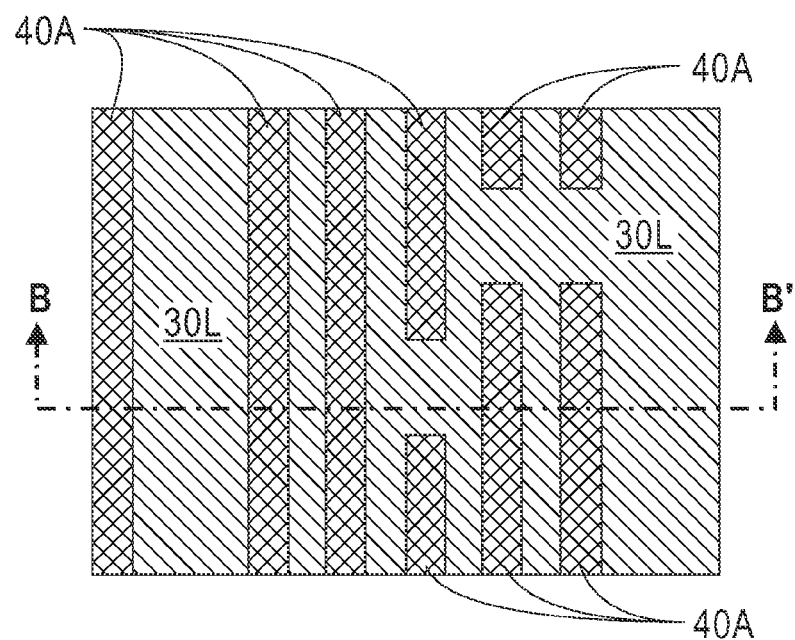
FIG. 7A is a top view of the exemplary semiconductor structure of FIGS. 6A and 6B after removing the first domains and remaining portions of patterned neutral layer to provide patterned hard mask layer portions containing a composite pattern of the template pattern and the DSA pattern.
Figure 7B:
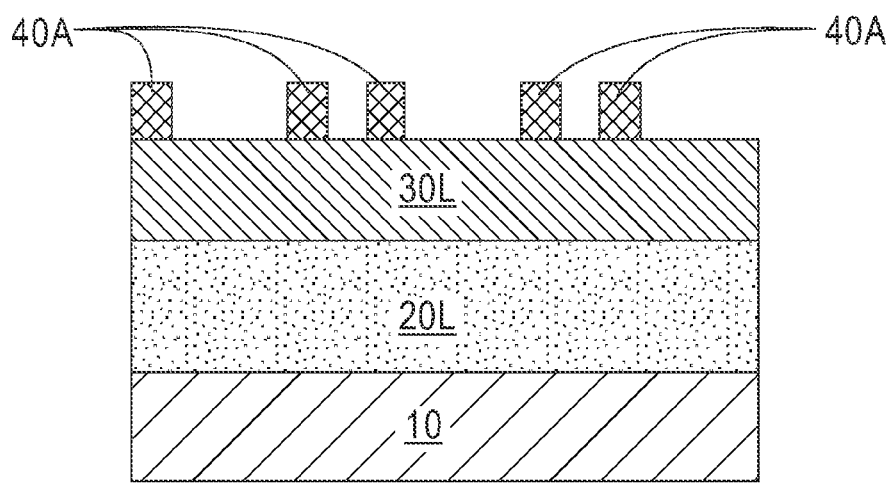
FIG. 7B is a cross-sectional view of the exemplary semiconductor structure of FIG. 7A along the vertical plane B-B'.

Referring to FIGS. 7A and 7B, after the formation of the composite pattern, the first domains 60A which are composed of the first component of the self-assembling material and the patterned neutral layer portions 50A may be removed by at least one etch which can be a dry etch or a wet chemical etch. The pattern defined by the combination of template pattern and the DSA pattern is thus replicated within vertical stacks of the patterned hard mask layer portions 40A.

In the present application, the composite pattern formed by the combination of the template pattern and the DSA pattern allows arbitrarily removing individual domains and/or cutting individual domains generated by the DSA of a self-assembling material without the need of additional aligned lithography steps, thus eliminating the overlay errors associate with misalignment of the lithographic trim pattern to the DSA pattern. As a result, the device yield, performance, reliability and uniformity can be enhanced.

Figure 8A:
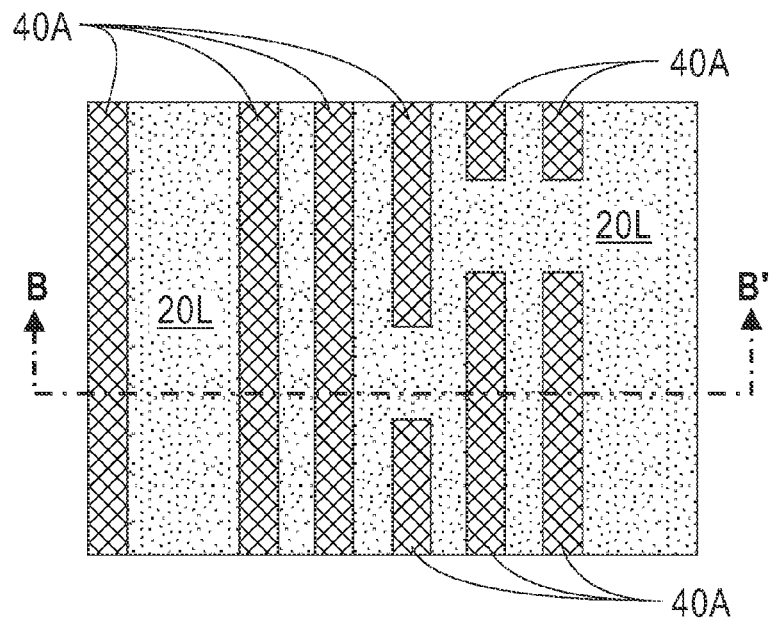
FIG. 8A is a top view of the exemplary semiconductor structure of FIGS. 7A and 7B after transferring the composite pattern into the transfer layer to provide a patterned transfer layer.
Figure 8B:
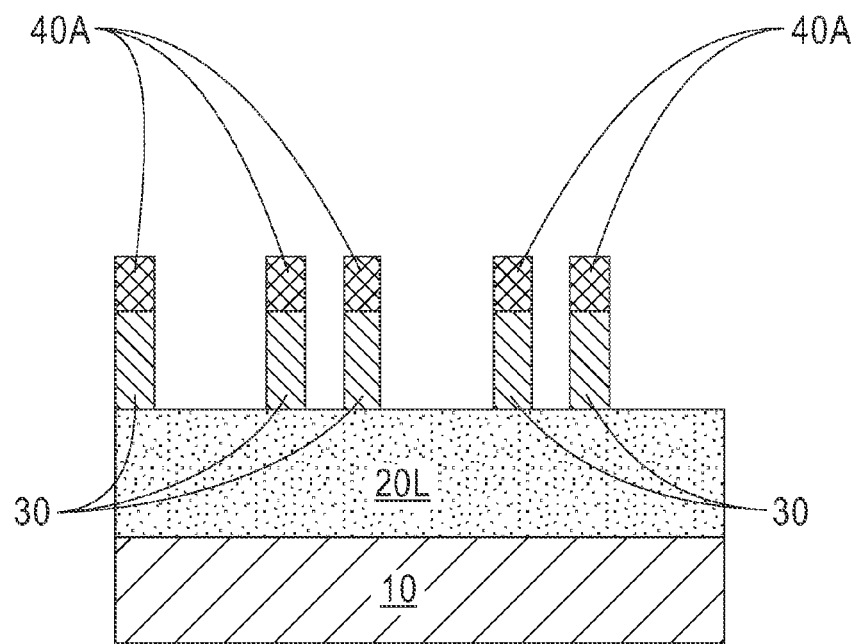
FIG. 8B is a vertical cross-sectional view of the exemplary semiconductor structure of FIG. 8A along the vertical plane B-B'.

Referring to FIGS. 8A and 8B, the composite pattern can be transferred into the transfer layer 30L by an anisotropic etch which can be a dry etch or a wet chemical etch. For example, the etching of transfer layer 30L may be performed employing an oxygen-containing plasma, such as $O_2$, $CO_2$/CO, $CO_2/N_2$, or a non-oxygen containing plasma, such as $H_2/N_2$ or $NH_3$. The transfer layer etch could be a full transfer layer etch or a partial transfer layer etch. In one embodiment and as shown in FIG. 7B, the transfer layer 30L is fully etched. The remaining portions of the transfer layer 30L constitute the patterned transfer layer 30.

Figure 9A:
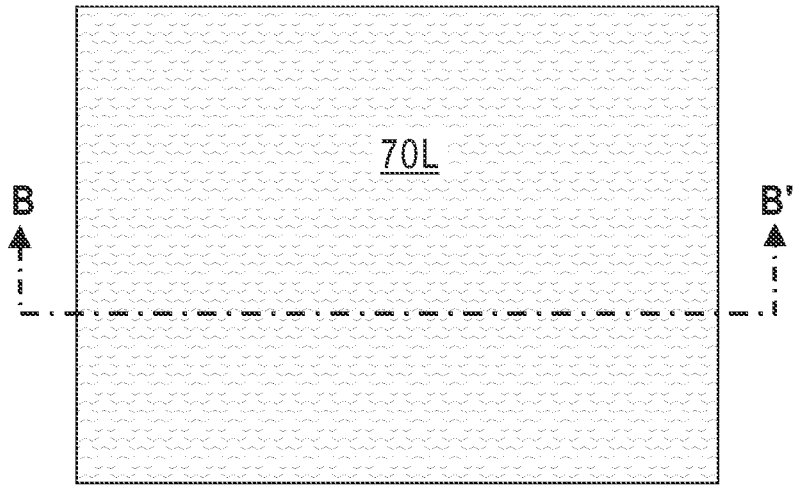
FIG. 9A is a top view of the exemplary semiconductor structure of FIGS. 8A and 8B after forming a tone-inversion layer over the patterned transfer layer and the patterned hard mask layer portions.
Figure 9B:
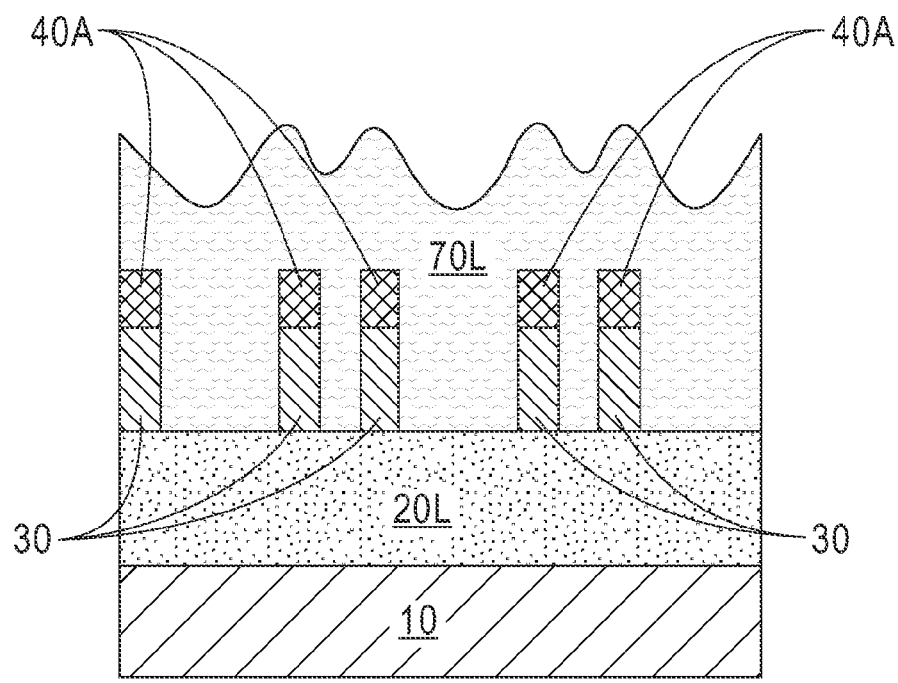
FIG. 9B is a cross-sectional view of the exemplary semiconductor structure of FIG. 9A along the vertical plane B-B'.

Referred to FIGS. 9A and 9B, a tone-inversion material, for example, a spin-on dielectric (SOD) material, is applied to fill the spaces between the stacks of the patterned transfer layer 30 and the patterned hard mask layer portions 40A and above the top surfaces of the patterned hard mask layer portion 40A to form a tone-inversion layer 70L. The tone-inversion material can be any material that fills spaces at a target resolution and has a high etch selectivity with respect to the materials of the transfer layer 30L and the dielectric material layer 20L. Exemplary tone-inversion materials include, but are not limited to, a Si-containing SOD material, a Ti-containing SOD material, a W-containing SOD material and a Hf-containing SOD material. A top surface of the tone-inversion layer 70L is located above the top surfaces of the patterned hard mask layer portions 40A.

Figure 10A:
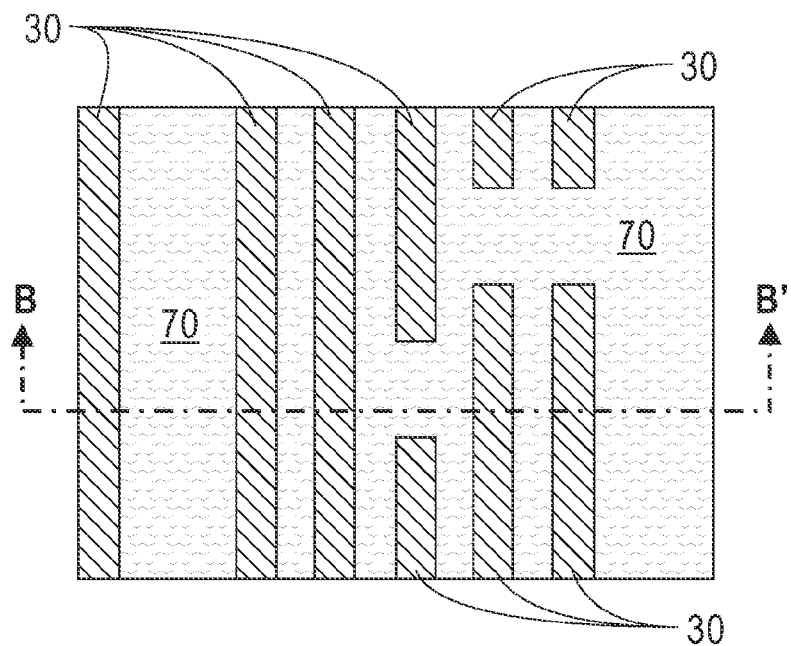
FIG. 10A is a top view of the exemplary semiconductor structure of FIGS. 9A and 9B after planarizing the tone-inversion layer and exposing the top of the patterned transfer layer so that the resulting tone-inversion layer portion fills the spaces between the patterned transfer layer.
Figure 10B:
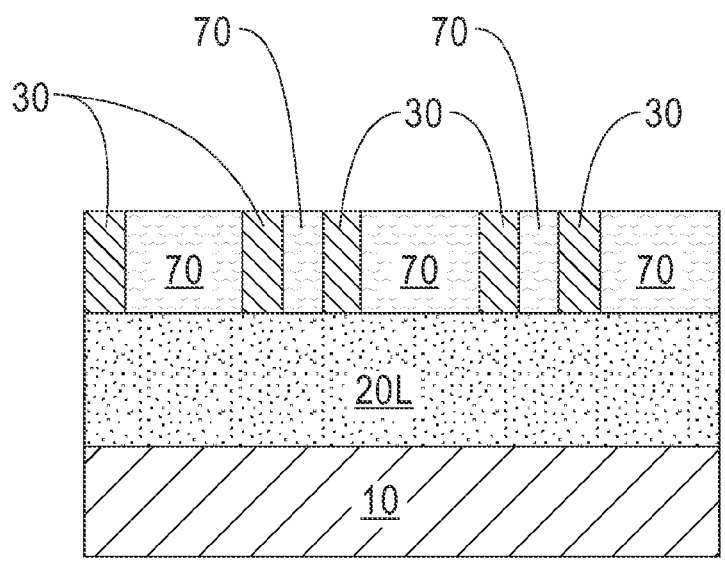
FIG. 10B is a cross-sectional view of the exemplary semiconductor structure of FIG. 10A along the vertical plane B-B'.

Referring to FIGS. 10A and 10B, the tone-inversion layer 70L is planarized and recessed to form tone-inversion layer portions 70 in the spaces between the patterned transfer layer 30. In one embodiment, the tone-inversion layer 70L is recessed to a depth at the top surface of the patterned transfer layer 30 such that the top surfaces of tone-inversion layer portions 70 do not exceed the height of the patterned transfer layer 30. In one embodiment, the top surfaces of the tone-inversion layer portions 70 are coplanar with the top surface of the patterned transfer layer 30. The recess of the tone-inversion layer 70L may be performed by chemical mechanical planarization (CMP), a recess etch, or a combination thereof.

Subsequently, any remaining patterned hard mask layer portions 40A may be removed by at least one etch selective to the tone-inversion portions 70.

The tone-inversion layer portions 70 form a third pattern that is a complementary pattern of the composite pattern of the template pattern and the DSA pattern. In other words, the area in which the third pattern in the tone-inversion layer portions 70 is present is the complement of the area in which the composite pattern of the template pattern and the DSA pattern is present as seen in a top-down view.

Figure 11A:
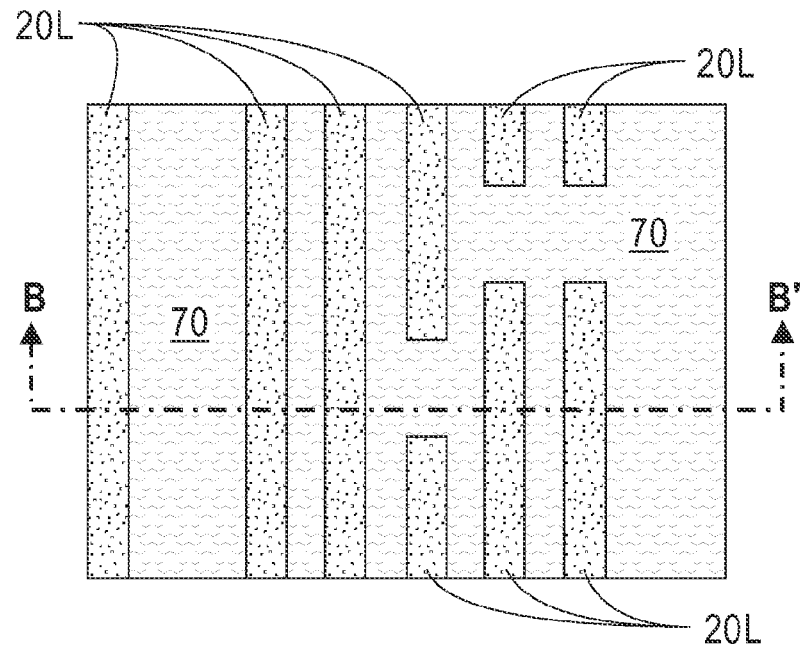
FIG. 11A is a top view of the exemplary semiconductor structure of FIGS. 10A and 10B after removing the patterned transfer layer.
Figure 11B:
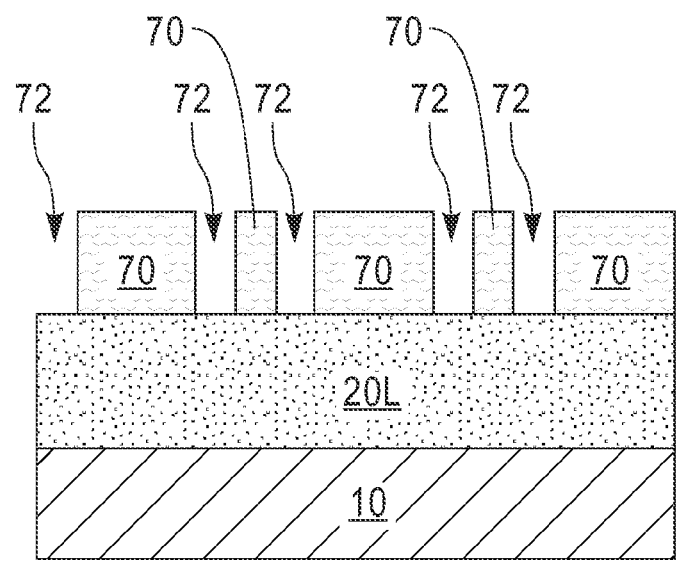
FIG. 11B is a vertical cross-sectional view of the exemplary semiconductor structure of FIG. 11A along the vertical plane B-B'.

Referring to FIGS. 11A and 11B, the patterned transfer layer 30 are removed selective to the tone-inversion layer portions 70. The removal of the patterned transfer layer 30 can be performed, for example, by an etch which can be a dry etch or a wet chemical etch. The line trenches 72 that are formed between the tone-inversion layer portions 70 have a uniform width, which is the same as the width of the first domains 60A, up to some small process bias due to the fill and etch. The line trenches 72 expose portions of the dielectric material layer 20L.

Figure 12A:
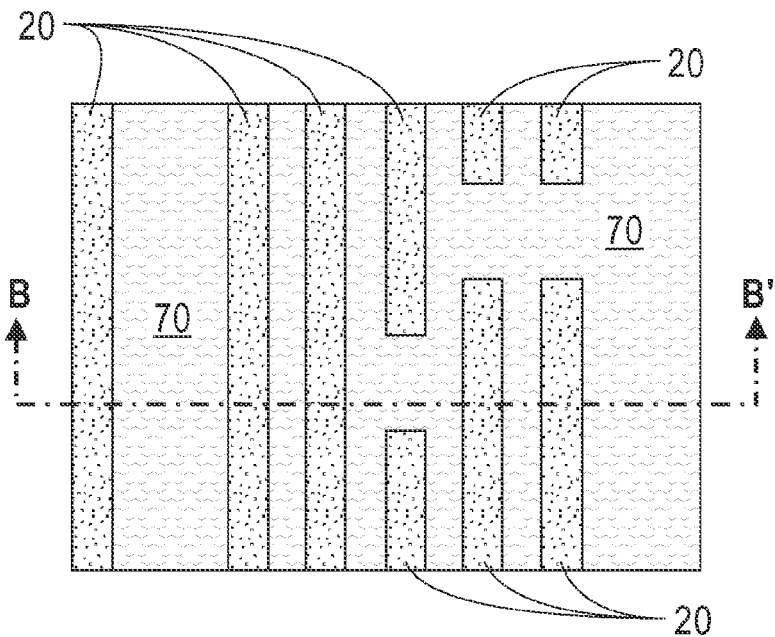
FIG. 12A is a top view of the exemplary semiconductor structure of FIGS. 11A and 11B after etching the dielectric material layer employing the tone-inversion layer portions as an etch mask to provide line trenches in the dielectric material layer.
Figure 12B:
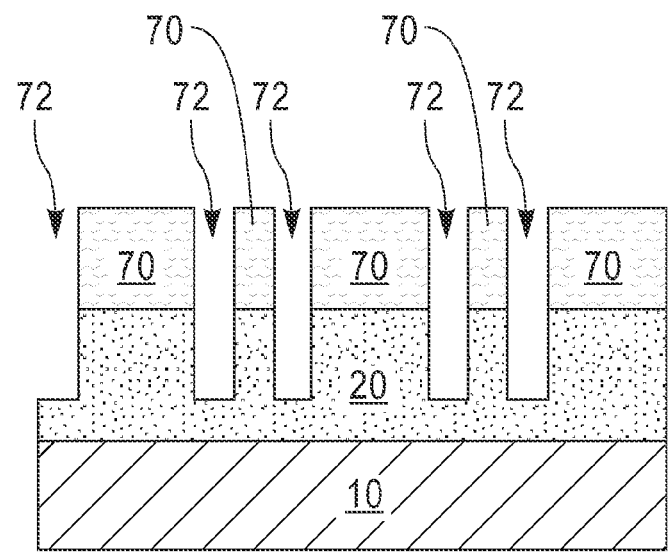
FIG. 12B is a cross-sectional view of the exemplary semiconductor structure of FIG. 12A along the vertical plane B-B'.

Referring to FIGS. 12A and 12B, exposed portions of the dielectric material layer 20L that are not covered by the tone-inversion layer portions 70 are removed by an anisotropic etch using the tone-inversion layer portions 70 as an etch mask. The etch could be a full etch or a partial etch. The anisotropic etch can be a dry etch or a wet chemical etch that removes the material of the dielectric material layer 20L selective to the material of the tone-inversion layer portions 70. The line trenches 72 are thus extended into the dielectric material 20L. The remaining portions of the dielectric material layer 20L constitute the patterned dielectric material layer 20.

Figure 13A:
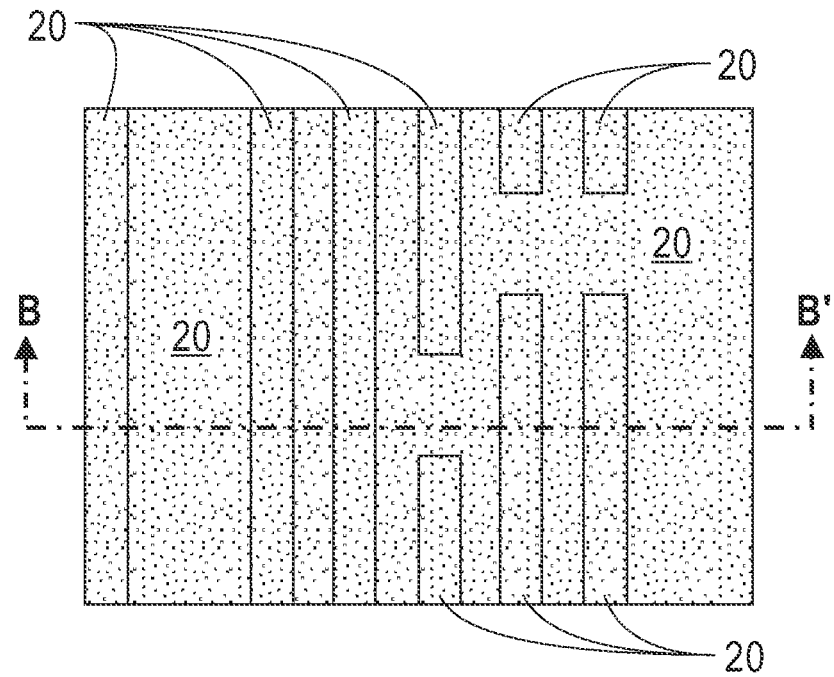
FIG. 13A is a top-down view of the exemplary semiconductor structure of FIGS. 12A and 12B after removing the tone-inversion layer portions.
Figure 13B:
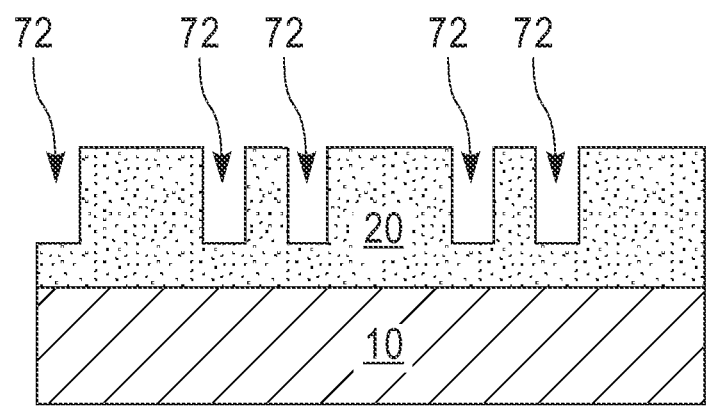
FIG. 13B is a vertical cross-sectional view of the exemplary semiconductor structure of FIG. 13A along the vertical plane B-B'.

Referring to FIGS. 13A and 13B, the tone-inversion layer portions 70 are removed by an etch. The etch can be a dry etch or a wet chemical etch that removes the material of the tone-inversion layer portions 70 selective to the materials of the patterned dielectric material layer 20 and possibly the substrate 10.

Figure 14A:
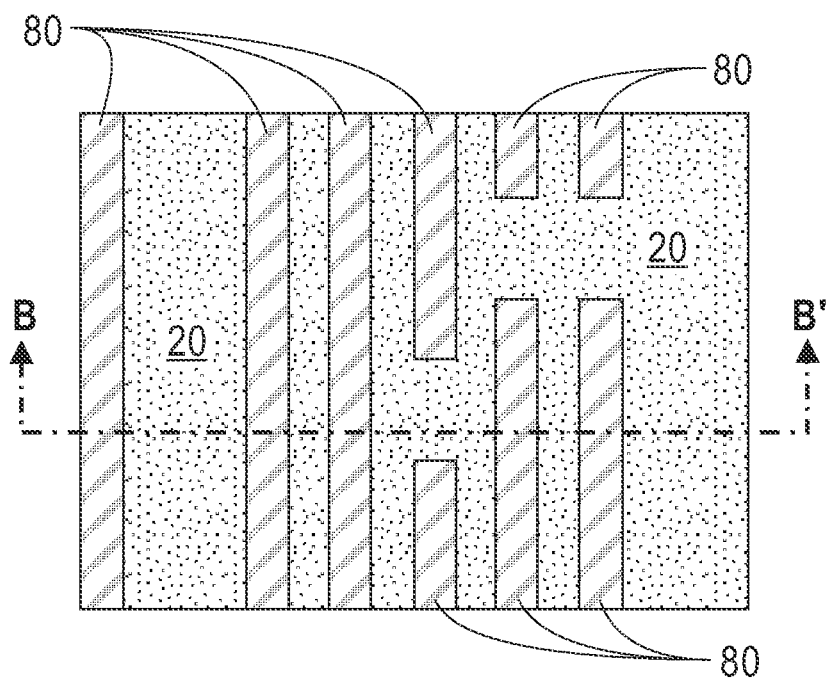
FIG. 14A is a top view of the exemplary semiconductor structure of FIGS. 13A and 13B after filling the line trenches with a conductive material to form interconnect lines.
Figure 14B:
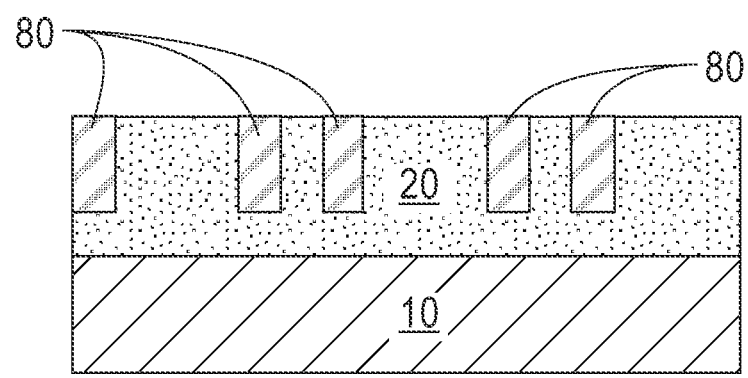
FIG. 14B is a cross-sectional view of the exemplary semiconductor structure of FIG. 14A along the vertical plane B-B'.

Referring to FIGS. 14A and 14B, a conductive material is deposited within line trenches 72 between the patterned dielectric material layer 20 for wiring applications. The conductive material includes a metal such as, for example, tungsten, aluminum, copper, tantalum, tantalum nitride, titanium, titanium nitride, or their alloys. In some embodiments of the present application, before depositing the conductive material, a conductive liner material may be deposited on sidewalls and bottom surfaces of the line trenches 72. The excess conductive material and the conductive liner material, if present, can be removed by planarization from above the top surface of the patterned dielectric material layer 20. The remaining portions of the conductive material within the line trenches 72 constitute interconnect lines 80. The interconnect lines 80 have a uniform width, which is the same as the width of the first domains 60A, up to some small process bias. However, the length of and position of each interconnect line 80 may vary. The length and position of interconnect lines 80 are dependent on the template pattern formed initially in the hard mask layer 40L. The interspacing between each pair of the interconnect lines 80 may also vary. In one embodiment, the interspacing distances between the interconnect lines 80 equal to integer multiples of the periodicity of the self-assembling material employed in the formation of the interconnect lines 80, with a minimum interspacing distance the same as the width of the second domains 60B, up to some small process bias. The interconnect lines 80 extend along a lengthwise direction which is a direction each interconnect line 80 extends the most, thus is unidirectional.

Figure 15A:
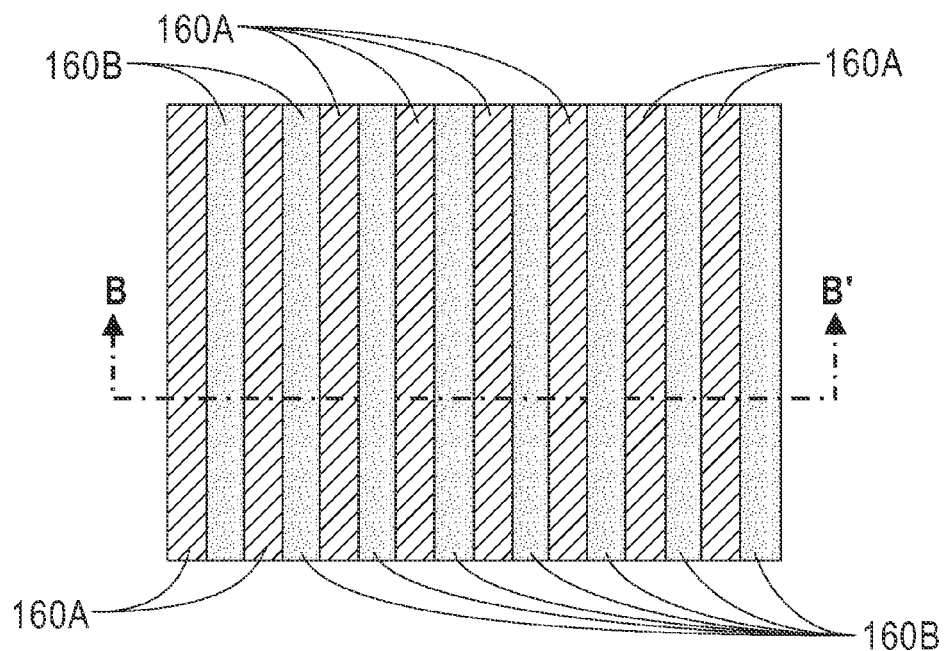
FIG. 15A is a top view of a variation of the exemplary semiconductor structure of FIGS. 4A and 4B in instances where the top surface of the transfer layer is preferential to the second component of the self-assembling material.
Figure 15B:
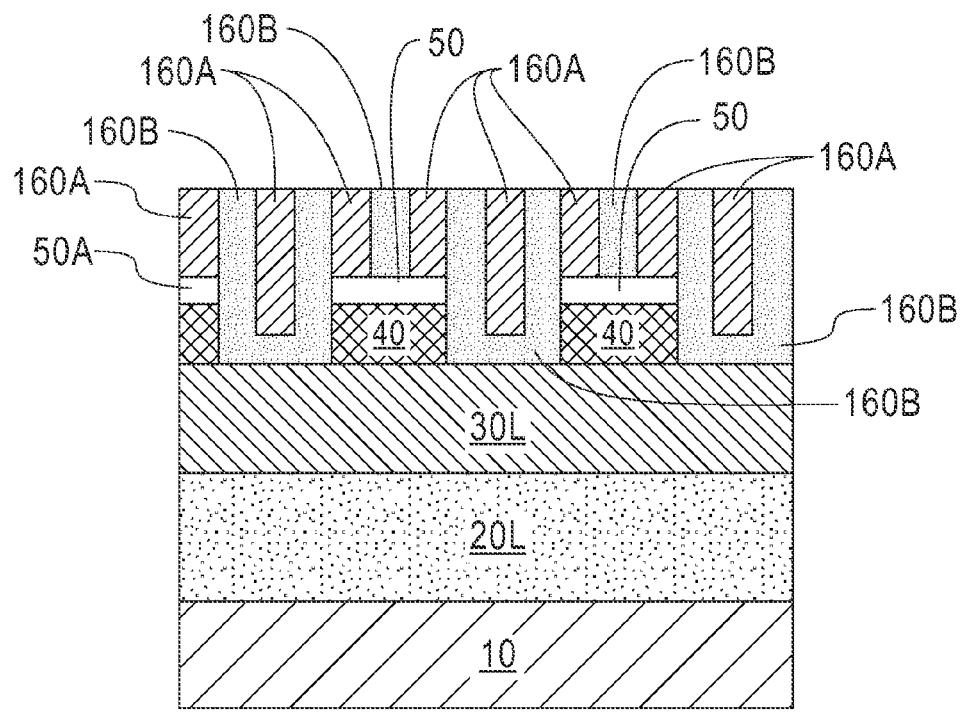
FIG. 15B is a cross-sectional view of the exemplary semiconductor structure of FIG. 15A along the vertical plane B-B'.

Referring to FIGS. 15A and 15B, a variation of the exemplary semiconductor structure of FIGS. 4A and 4B can be obtained in instances where the top surface of the transfer layer 30L is preferential to one component of the self-assembling material. In the case shown in FIG. 15B, the second component of the self-assembling material wets the top surface of the transfer layer 30L, thus within the trenches 57A, 57A, each of the second domains 160B includes a horizontal portion in contact with the top surface of the transfer layer. A lamellar structure containing alternating first domains 160A and second domains 160B is formed on top of the patterned neutral layer 50.

Figure 16A:
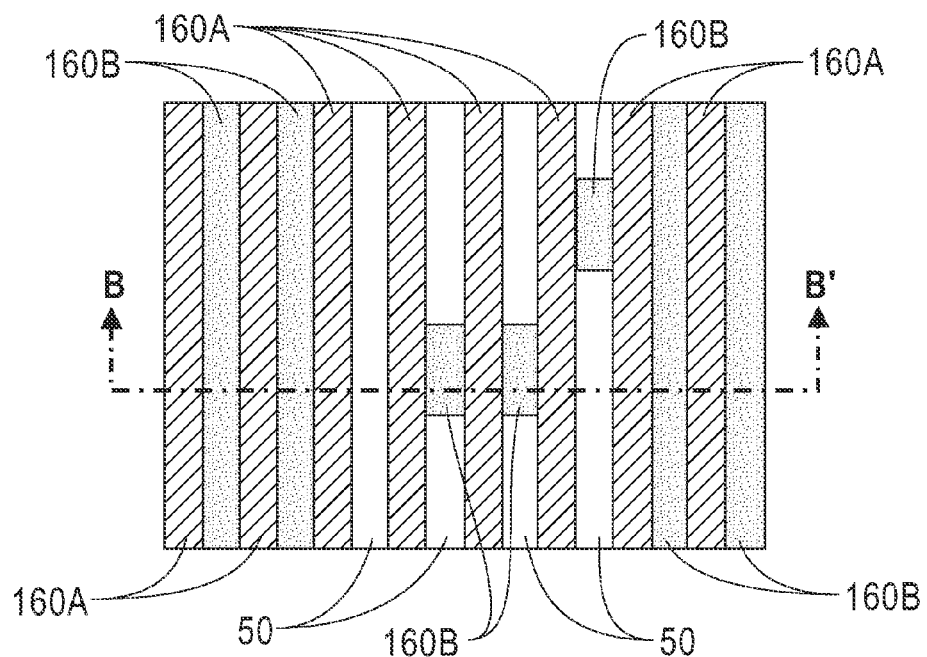
FIG. 16A is a top view of the exemplary semiconductor structure of FIGS. 15A and 15B after etching down the second domains selective to the first domains to form a DSA pattern with first domains on top of the patterned neutral layer.
Figure 16B:
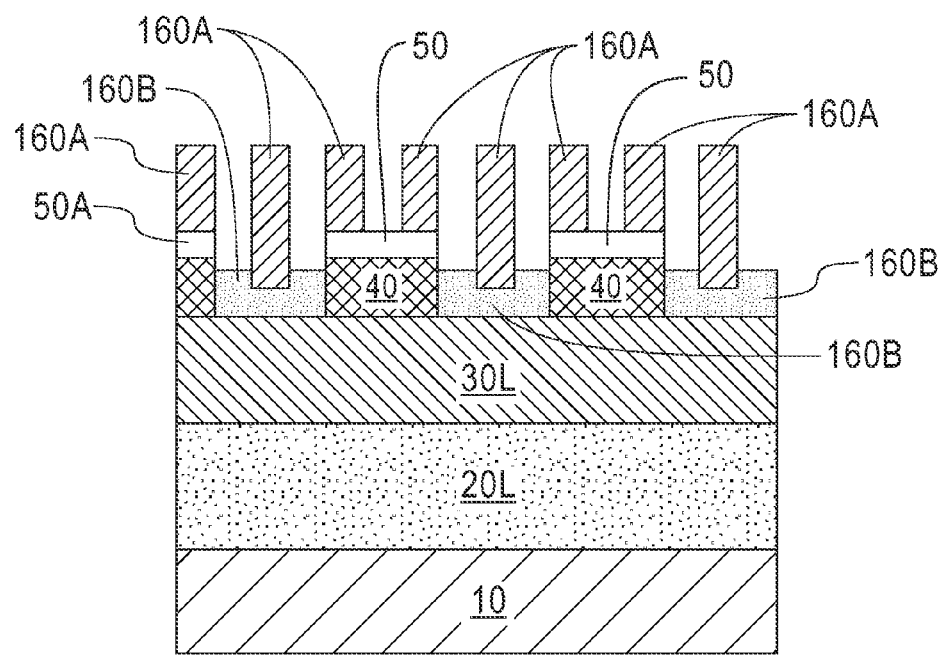
FIG. 16B is a cross-sectional view of the exemplary semiconductor structure of FIG. 16A along the vertical plane B-B'.

Referring to FIGS. 16A and 16B, the second domains 160B are etched down selective to the first domains 160A such that the top surface of the patterned neutral layer 50 is exposed. Horizontal portions of the second domains 160B within the trenches 57A, 57B may remain on the top surface of the transfer layer 30L. The removal of the second domains 160B selective to the first domains 160A can be effected by performing processing steps of FIGS. 5A-5B.

Figure 17A:
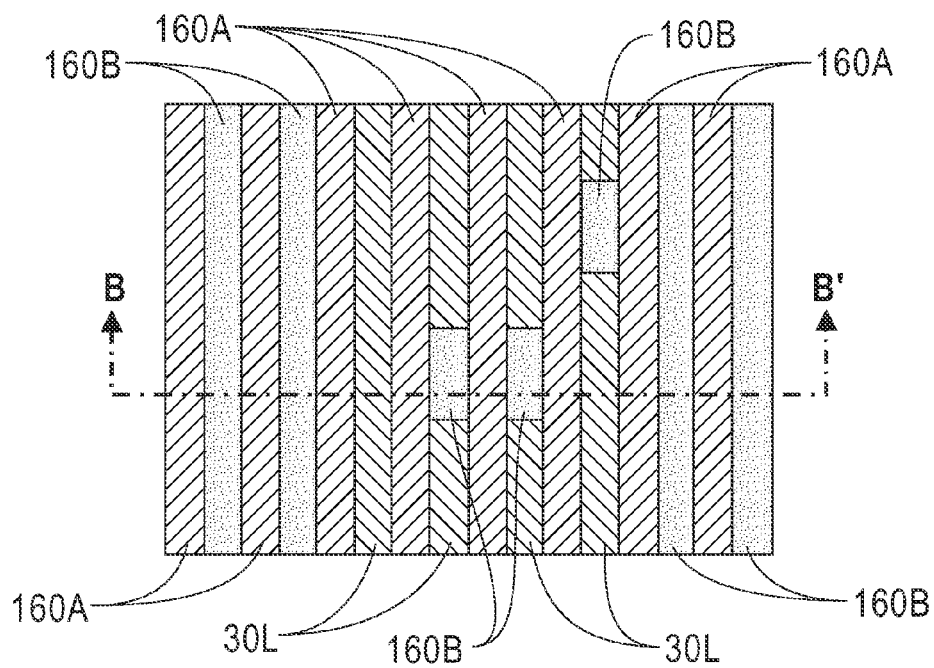
FIG. 17A is a top view of the exemplary semiconductor structure of FIGS. 16A and 16B after removing portions of the patterned neutral layer and the patterned hard mask layer that are not covered by the first domains.
Figure 17B:
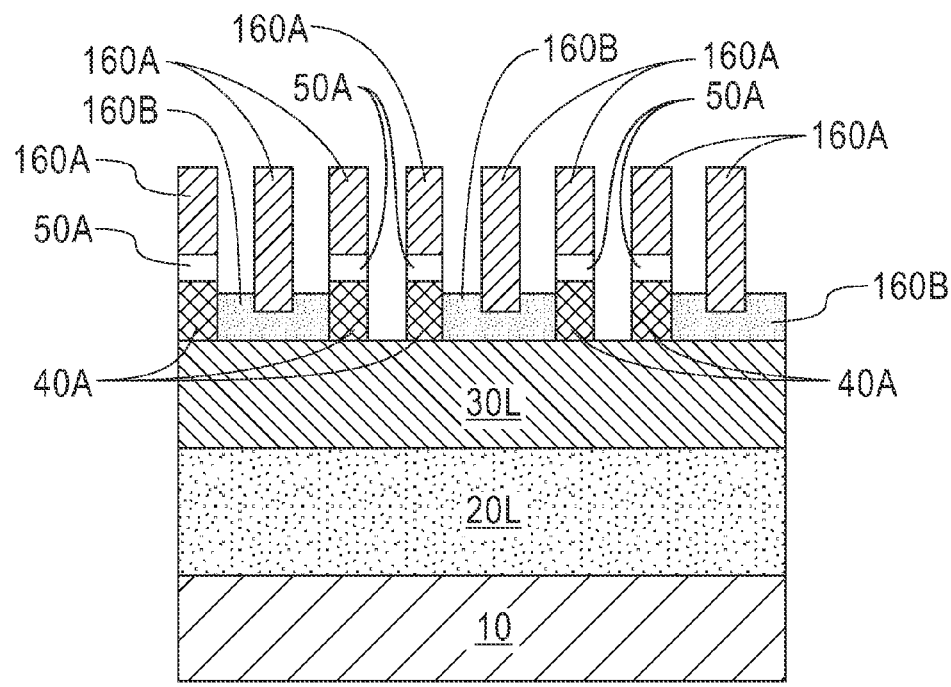
FIG. 17B is a cross-sectional view of the exemplary semiconductor structure of FIG. 17A along the vertical plane B-B'.

Referring to FIGS. 17A and 17B, portions of the patterned neutral layer 50 and the underlying patterned hard mask layer 40 that are not covered by the first domains 60A are removed by performing processing steps of FIGS. 6A-6B.

Subsequently, the remaining self-assembling material (i.e., the first domains 160A and the horizontal portions of the second domains 160B) and the patterned neutral layer portions 50A may be removed by performing processing steps of FIGS. 7A and 7B to provide the patterned hard mask layer portions 40A of FIGS. 7A and 7B. After the formation of the patterned hard mask layer portions 40A, the process flow described above in FIGS. 8A-8B, 9A-9B, 10A-10B, 11A-11B, 12A-12B, 13A-13B and 14A-14B may be employed to form interconnect structures 80.

Although the self-assembled structure of the self-assembling material formed on top of the transfer layer shown in FIG. 15B is different from the self-assembled structure shown in FIG. 4B, both self-assembled structures result in the same composite pattern described above in FIGS. 7A and 7B. Therefore, in the present application, the details of the exact assembly of the self-assembling material on top of the transfer layer are not relevant to the formation of the composite pattern, only the self-alignment of the phase-separated self-assembling material to the template pattern and the details of the phase separation on top of the patterned neutral layer are crucial to the formation of the composite pattern.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A method of forming a semiconductor structure comprising:

forming a vertical stack of a patterned hard mask layer and a patterned neutral layer overlying the patterned hard mask layer over a transfer layer located over a substrate, wherein the patterned hard mask layer and the patterned neutral layer include a first pattern of trenches exposing portions of the transfer layer;

applying a self-assembling material over the transfer layer and the patterned neutral layer;

forming a self-assembled self-aligned structure of the self-assembling material across top surfaces of the transfer layer and the patterned neutral layer, the self-assembled self-aligned structure comprising alternating first domains and second domains composed of first and second components of the self-assembling material, respectively;

forming a second pattern of the first domains by removing the second domains selective to the first domains;

patterning the patterned neutral layer and the patterned hard mask layer by employing portions of the first domains not intersecting the trenches as an etch mask;

patterning the transfer layer employing remaining portions of the patterned hard mask layer as an etch mask to provide a patterned transfer layer; and forming tone-inversion layer portions by filling the spaces between the patterned transfer layer with a tone-inversion material.

2. The method of claim 1, further comprising removing the first domains prior to the patterning the transfer layer.

3. The method of claim 1, wherein the tone-inversion layer portions constitute a third pattern which is a complementary pattern of a composite pattern of the first pattern and the second pattern.

4. The method of claim 1, wherein the forming the self-assembled self-aligned structure of the self-assembling material is performed by an anneal.

5. The method of claim 4, wherein the anneal comprises a thermal anneal or a solvent vapor anneal.

6. The method of claim 1, wherein each of the first domains has a first width, and each of the second domains has a second width.

7. The method of claim 6, wherein the first width ranges from 5 nm to 50 nm, and wherein the second width ranges from 5 to 50 nm.

8. The method of claim 6, wherein the forming the vertical stack of the patterned hard mask layer and the pattern neutral layer comprises:

forming a blank photoresist layer over a material stack located on the substrate, the material stack comprising, from bottom to top, a dielectric material layer, the transfer layer, a hard mask layer and a neutral layer;

lithographically exposing and developing the blank photoresist layer to form a patterned photoresist layer; and removing portions of the neutral layer and the hard mask layer that are not covered by the patterned resist layer to provide the patterned hard mask layer and the patterned neutral layer.

9. The method of claim 8, further comprising patterning the dielectric material layer employing the tone-inversion layer portions as an etch mask to form line trenches in the dielectric material layer.

10. The method of claim 9, further comprising filling lines trenches with a conductive material to provide interconnect lines therein.

11. The method of claim 10, wherein the conductive material comprise tungsten, aluminum, copper, tantalum, tantalum nitride, titanium, titanium nitride, or alloys thereof.

12. The method of claim 10, wherein each of the interconnect lines has a width the same as the first width.

13. The method of claim 10, further comprising removing the patterned transfer layer prior to the patterning the dielectric material layer.

14. The method of claim 13, further comprising removing the tone-inversion layer portions prior to the formation of the interconnect lines.

15. The method of claim 1, wherein the first pattern of trenches includes first trenches located at areas where unnecessary lines are present and second trenches located at areas where unnecessary portions of lines are present according to a circuit design.

16. The method of claim 1, wherein the self-assembling material comprises a block copolymer, wherein the self-aligned assembly is formed by micro-phase separation of the block copolymer, and wherein the first domains comprise a first polymeric block component of the block copolymer, and the second domains comprise a second polymeric block component of the block copolymer.

17. The method of claim 1, wherein the self-assembling material is applied until a top surface of the self-assembling material is above a top surface of the patterned neutral layer.

18. The method of claim 1, wherein the tone-inversion material comprises a spin-on dielectric (SOD) material selected from the group consisting of a Si-containing SOD material, a Ti-containing SOD material, a W-containing SOD material, and a Hf-containing SOD material.

19. The method of claim 1, wherein the first domains and the second domains are oriented perpendicularly to top surfaces of the transfer layer and the patterned neutral layer.

20. The method of claim 1, wherein the first domains and the second domains are oriented perpendicularly to a top surface of the patterned neutral layer, but not a top surface of the transfer layer.

* * * * *